(12) United States Patent
Zansky

(10) Patent No.: US 7,379,282 B1
(45) Date of Patent: May 27, 2008

(54) INPUT AND OUTPUT ISOLATING DIODE FOR POWER DISSIPATION REDUCTION OF POWER SUPPLIES

(75) Inventor: Zoltan Zansky, San Carlos, CA (US)

(73) Assignee: Network Appliance, Inc, Sunnyvale, CA (US)

( * ) Notice: Subject to any disclaimer, the term of this patent is extended or adjusted under 35 U.S.C. 154(b) by 264 days.

(21) Appl. No.: 10/329,870

(22) Filed: Dec. 26, 2002

(51) Int. Cl.
*H02H 7/00* (2006.01)

(52) U.S. Cl. .................................. 361/82; 361/18

(58) Field of Classification Search .................. 361/87, 361/91.1, 91.2, 91.3, 91.5, 18, 92, 82; 326/112–114; 307/58, 127
See application file for complete search history.

(56) References Cited

U.S. PATENT DOCUMENTS

| | | | |
|---|---|---|---|
| 5,686,814 A | * | 11/1997 | Wierzbicki .................. 307/51 |
| 5,811,895 A | * | 9/1998 | Suzuki et al. ............... 307/125 |
| 5,945,816 A | * | 8/1999 | Marusik ...................... 323/273 |
| 6,281,724 B1 | * | 8/2001 | Ellis ........................... 327/143 |
| 6,420,906 B1 | * | 7/2002 | Kohda ......................... 326/114 |
| 6,462,434 B1 | * | 10/2002 | Winick et al. ................ 307/85 |

* cited by examiner

*Primary Examiner*—Michael Sherry
*Assistant Examiner*—Danny Nguyen
(74) *Attorney, Agent, or Firm*—Suiter Swantz pc llo

(57) ABSTRACT

The present invention is a method and system for providing improved isolation for power supplies while minimizing power dissipation. A body diode of a MOSFET may be utilized with a comparator circuit. The comparator circuit may detect current flow across the MOSFET and may turn the MOSFET on. This may shunt the diode with a low drain to source resistance limiting power dissipation across the diode to an amount of the drain to source current squared $(Ids^2)$ times the drain to source resistance of the MOSFET when on (RDSon). Use of the comparator circuitry may reduce the time delay associated with turning the MOSFET off to prevent a high reverse inrush current within a power supply.

24 Claims, 4 Drawing Sheets

INPUT AND OUTPUT ISOLATING DIODE FOR POWER DISSIPATION REDUCTION OF POWER SUPPLIES

FIELD OF THE INVENTION

The present invention generally relates to the field of power supplies, and more particularly to a method and system for providing isolation for power supplies while minimizing power dissipation for input and output diodes.

BACKGROUND OF THE INVENTION

Conventional power supply electric safety specifications require that input terminals of a power supply have no voltage when a power source for the power supply is shut down. In order to meet this requirement, power supply designers typically employ an "OR" diode in series with the input bus to prevent input storage capacitor charge to flow backward to the input terminals of the power supply. This may eliminate fire and electrical shock hazards. Additionally, an "OR" diode may also be utilized in redundant power supply systems at the outputs of parallel connected power supplies to prevent a power supply with a low output voltage from drawing current from a power supply with a higher output voltage or vice versa. An "OR" diode may refer to a plurality of diodes in which the cathodes of each diode are connected to a common output of a plurality of redundant power supplies and anodes of each diode are coupled to the individual outputs of the individual power supplies.

A problem associated with the use of a diode to provide isolation is the voltage drop associated with a diode. Typically, diodes create a 0.7 volt drop that causes a substantial power loss for the power supply system. One approach utilized to reduce power loss has been the use of a Schottky diode. Schottky diodes may reduce the voltage drop to a 0.3-0.4 volt drop. A further reduction of power loss may be achieved through use of a MOSFET body diode that is shunted when the MOSFET is turned on. This reduces the power dissipation to an amount of the drain to source current squared ($Ids^2$) times the drain to source resistance of the MOSFET when on (RDSon) which is a fraction of the power dissipation of a diode. When an input voltage is present at the MOSFET, the MOSFET turns on, allowing current to flow. When an input voltage is not present, input storage capacitor charge may not flow backward to the input terminals of the power supply.

A drawback associated with MOSFET circuits based on input voltage sensing is the time delay between shutting down a voltage source and when the MOSFET has been switched off. This may allow the input voltage to persist at the input terminals of the power supply for several hundred milliseconds after the input supply has been shut off. Additionally, a current of an amount up to hundreds of amperes may exist for several milliseconds to the voltage source. Consequently, a method and system for providing improved isolation for power supplies while minimizing power dissipation is necessary.

SUMMARY OF THE INVENTION

Accordingly, the present invention is directed to a method and system for providing improved isolation for power supplies while minimizing power dissipation. In an embodiment of the present invention, a body diode of a MOSFET may be utilized with a comparator circuit. Current flow may be detected by determining a voltage drop caused by current flow across the MOSFET. The MOSFET may be turned on when current flows from the anode to the cathode of the diode. This may allow shunting of the diode with a low drain to source resistance without the time delay associated with MOSFET circuits employing input voltage detection known to the art. Power dissipation across the diode may also be reduced by the MOSFET to an amount of the drain to source current squared ($Ids^2$) times the drain to source resistance of the MOSFET when on (RDSon).

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
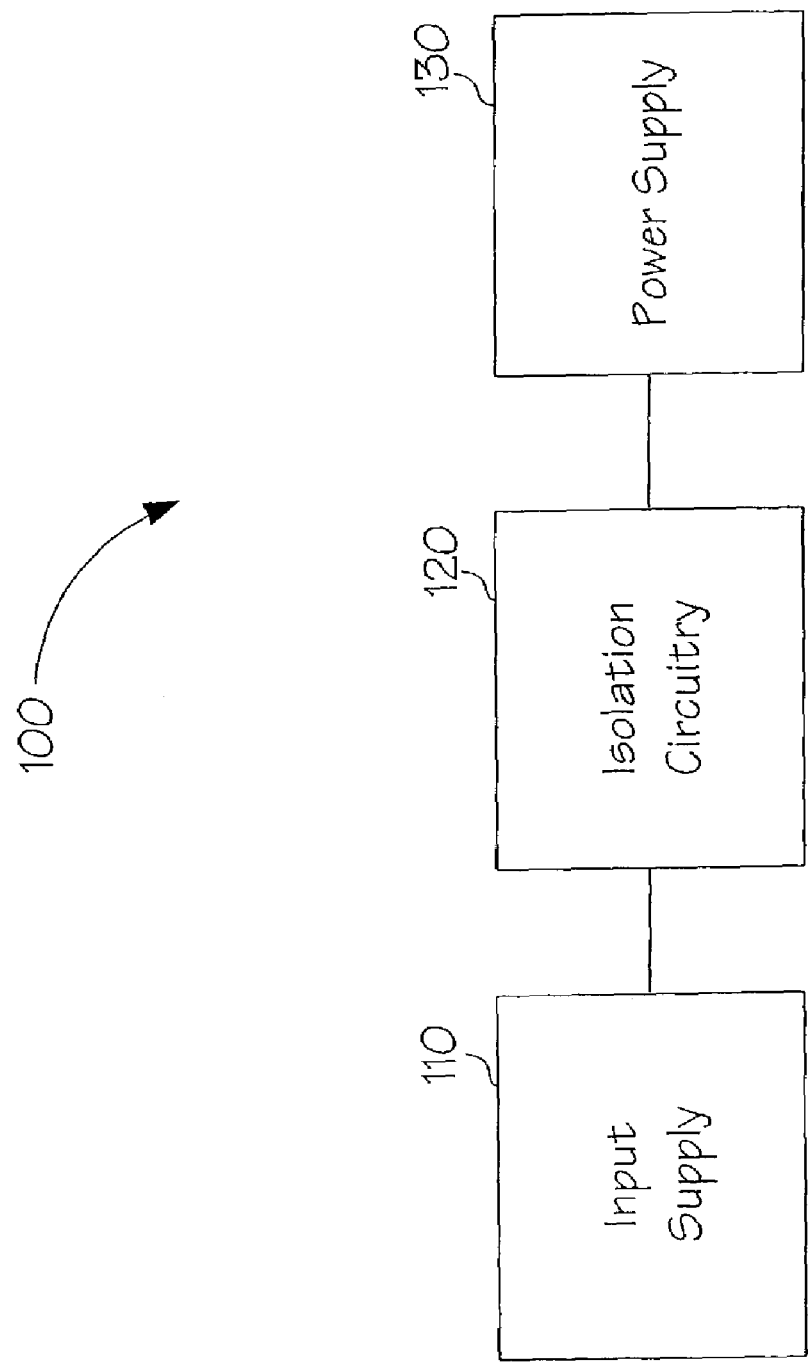
FIG. 1 depicts a block diagram of a power supply system in accordance with an embodiment of the present invention.

Referring to FIG. 1, a power supply system 100 in accordance with an embodiment of the present invention is shown. In an embodiment of the invention, power supply system 100 may include an input supply 110, isolation circuitry 120 and a power supply 130. In one embodiment of the invention, input supply 110 may be a direct current (DC) voltage source. Power supply 130 may be a DC/DC conversion power supply capable of receiving an unregulated DC voltage source and providing a regulated voltage source. It should be understood by those with ordinary skill in the art that isolation circuitry may be employed with many types of power delivery systems in order to prevent the reverse flow of current without departing from the scope and spirit of the present invention.

Specifications for a power supply 130 typically include that input terminals of a power supply 130 have no voltage when an input supply 110 is shut down. Isolation circuitry 120 of the present invention may prevent input storage capacitor charge flow backward to the input terminals of the power supply 130. This is advantageous as this may prevent fire and electrical shock hazards.

Another advantageous aspect of the isolation circuitry 120 of the present invention is the ability to reduce power dissipation when the input supply 110 is operating. Conventional diodes and Schottky diodes have been utilized to provide isolation, however, diodes and Schottky diodes create a voltage drop of at least 0.3 volts. Thus, power loss at 1 volt at a current of 20 amperes is 20 watts. Consequently, there is a large power loss with conventional techniques that must be compensated in the design of power supplies. The isolation circuitry 120 of the present invention reduces the power dissipation by the employment of an effectively "ideal" diode. The isolation circuitry 120 of the present invention may have a drain to source resistance of 1-10 milliOhms. Advantageously, power loss of the isolation circuitry 120 of the present invention at 20 amperes would be an amount of current, squared, times the resistance, thus, less than 4 watts at a 10 milliOhm resistance.

Figure 2:
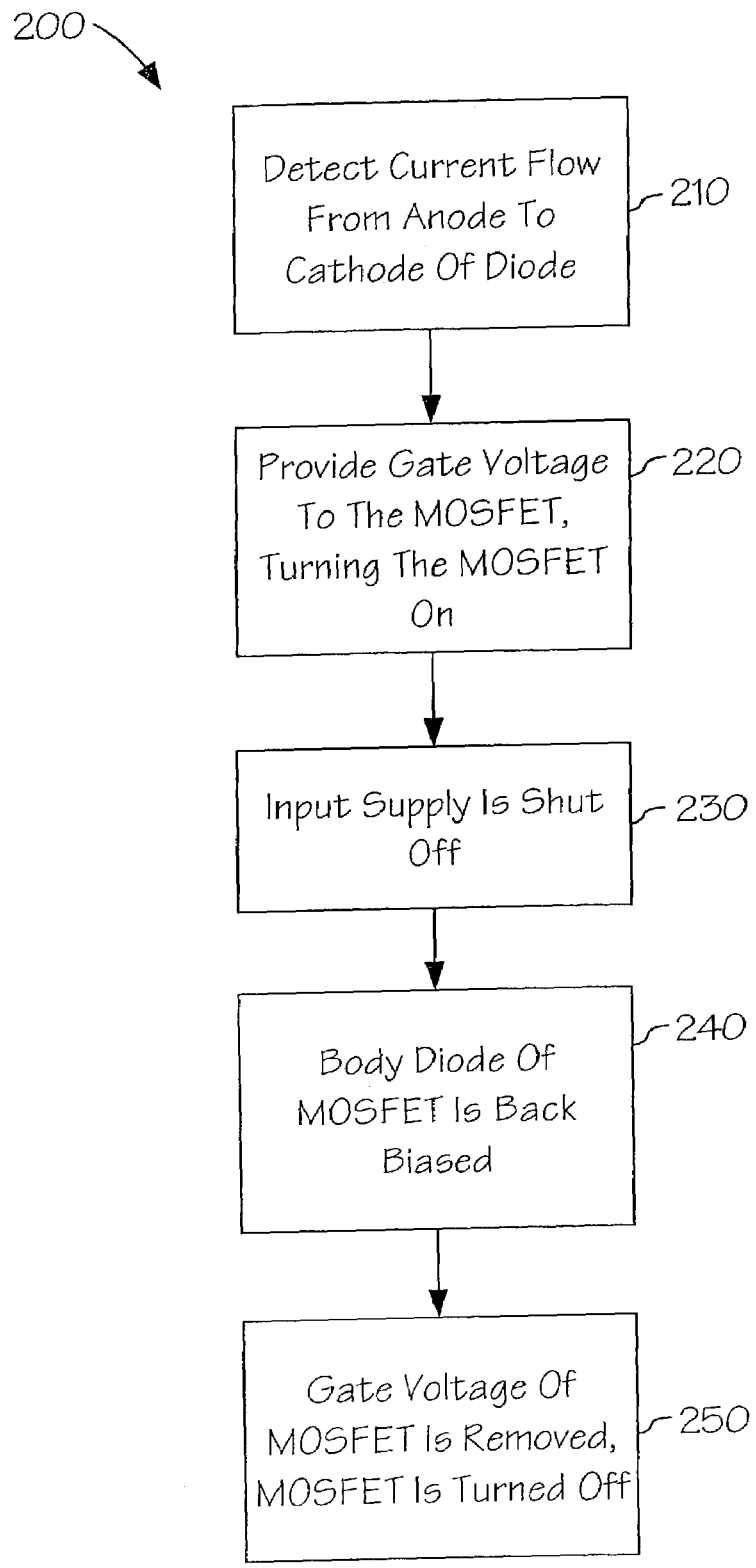
FIG. 2 depicts a process for isolating a power supply while minimizing power dissipation.

Referring now to FIG. 2, a process for isolating a power supply while minimizing power dissipation is shown. In one embodiment of the invention, process 200 may be implemented by isolation circuitry 120 of FIG. 1. Process 200 may begin by detecting current flow in a direction of anode to cathode of a body diode of a MOSFET signaling that an input supply is operating 210. A body diode of a MOSFET may refer to the internal diode created during fabrication of the MOSFET. Upon the detection of current flow from anode to cathode, a comparator may provide a gate voltage to the MOSFET, turning the MOSFET on 220. When the MOSFET has been turned on, current may pass with minimal power dissipation. The power dissipation may be an amount of the drain to source current squared ($Ids^2$) times the drain to source resistance of the MOSFET when on (RDSon).

When an input supply is shut off 230, the body diode of the MOSFET may be back biased 240. In one embodiment of the invention, this may be accomplished by pulling an input of the comparator and the anode of the MOSFET body diode to ground. This may cause the comparator to remove the gate voltage to the MOSFET and shutting the MOSFET off 250. An advantageous aspect of the process 200 of the present invention is the short time period in which the MOSFET is shut off after the input supply has been shut down. In one embodiment of the invention, the MOSFET may be shut off a few microseconds after the input supply has been shut down. This may prevent a high reverse inrush current into the input supply when the voltage of the input supply is shut down.

In another advantageous aspect of the present invention, process 200 of the present invention may be periodically or continuously repeated. Monitoring of current flow may be continuous, thus the comparator of the present invention may control the MOSFET as necessary depending upon whether an input supply is operating or not operating. This may ensure isolation for a power supply on a continuous basis.

Figure 3:
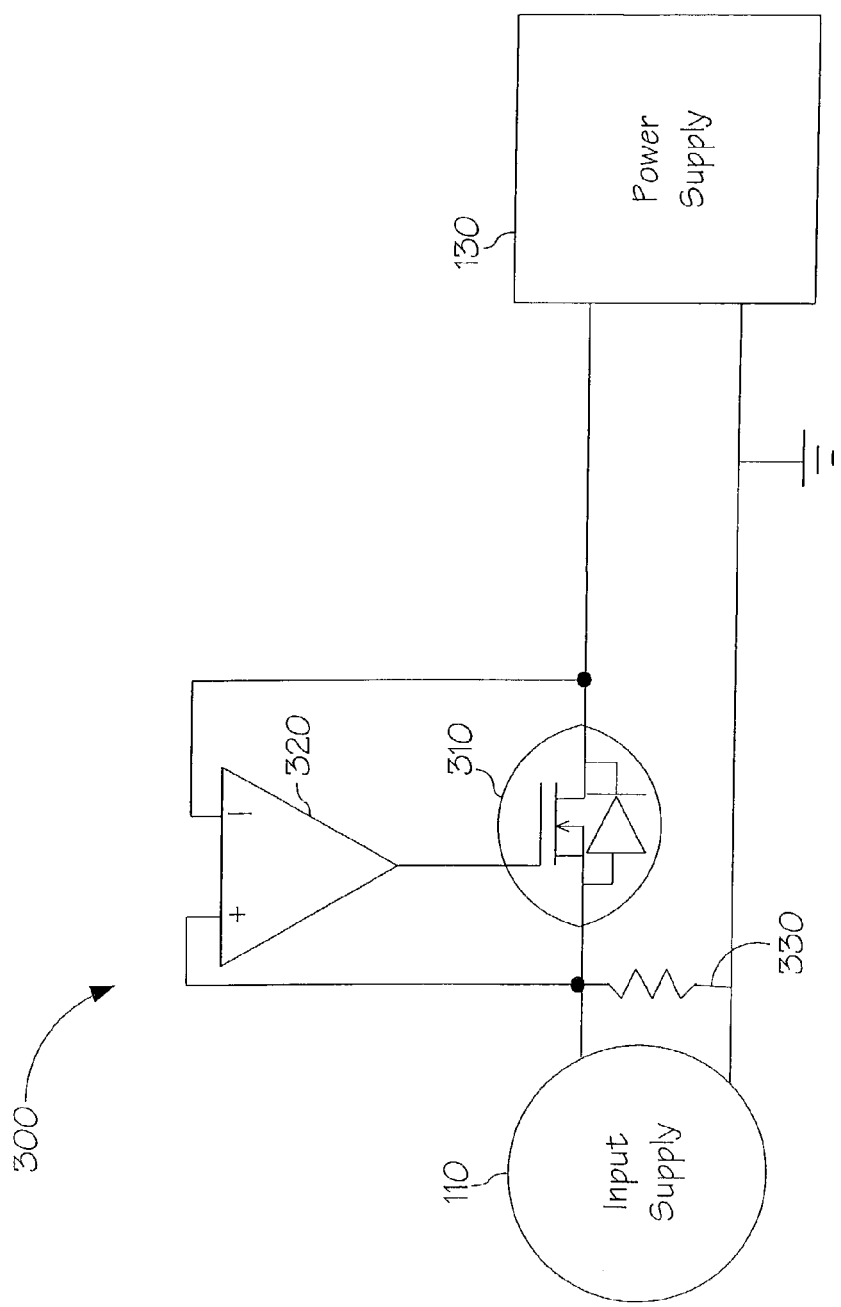
FIG. 3 depicts a power supply system in accordance with the present invention.

Referring now to FIG. 3, a power supply system 300 in accordance with the present invention is shown. FIG. 3 represents an embodiment of power supply system 100 of FIG. 1. Power supply system 300 may execute process 200 of FIG. 2 to provide improved isolation for power supply 340 while minimizing power dissipation.

Power supply system 300 may include an input supply 110. Isolation circuitry 120 of FIG. 1 may include a MOSFET 310, a comparator 320 and a resistor 330. The MOSFET 310, comparator 320 and resistor 330 may operate to allow current to pass with minimal power dissipation while providing input isolation for power supply 130 when input supply 110 is shut down. When current flows from the anode to cathode of a body diode of MOSFET 310, comparator may detect the current flow and provide a gate voltage to MOSFET 310. This may cause MOSFET 310 to turn on, allowing current to flow through from input supply 110 to power supply 130 with minimal power dissipation. In an embodiment of the invention, MOSFET may be a very low "on resistance" type of transistor. Thus, power dissipation may be an amount of the drain to source current squared ($Ids^2$) times the drain to source resistance of the MOSFET when on (RDSon).

An advantageous aspect of the power supply system 300 of FIG. 3 is the rate at which the MOSFET 310 is shut off after the input supply 110 has been shut down. MOSFET isolation circuits known to the art are based on sensing the slow voltage decay across the input holdup capacitor across the input of power supply 410. This is accompanied with a significant time delay between the time an input supply 110 is shut down and when the MOSFET is switched off. This causes the output voltage of the input supply 110 to remain at the input terminals of the power supply 130 for several hundred milliseconds. Additionally, a high reverse inrush current to the input supply is produced. The isolation circuitry of the present invention including use of a comparator 320 may be based upon current caused voltage drop polarity measurement across the MOSFET, which may reduce the delay of switching the MOSFET off to a few microseconds.

Figure 4:
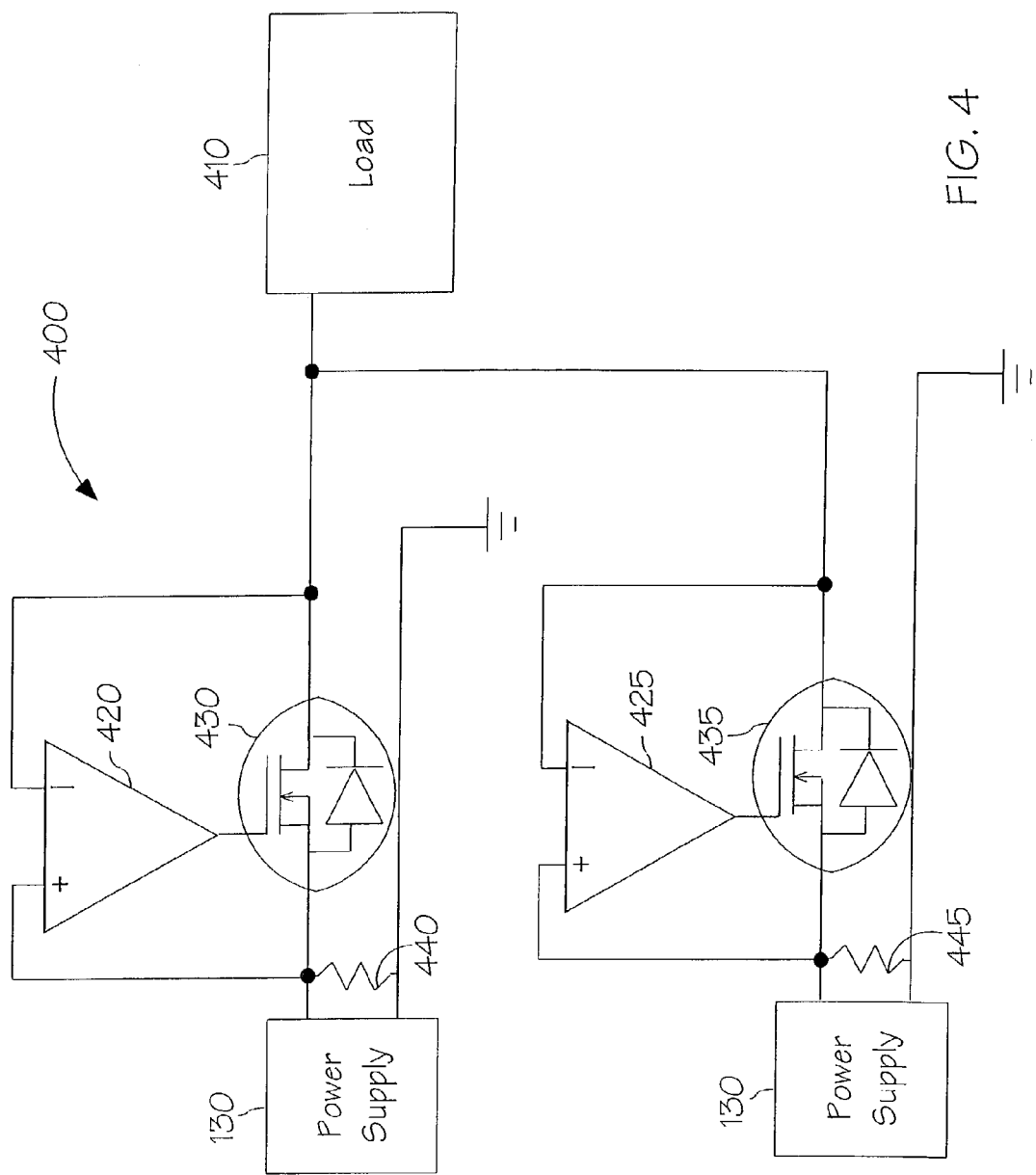
FIG. 4 depicts an alternative embodiment of a power supply system in accordance with the present invention.

Referring to FIG. 4, an alternative embodiment of a power supply system 400 in accordance with the present invention is shown. The isolation circuitry of the power supply system 400 may reduce the power loss of typical "OR" diodes of parallel-connected power supplies. In an embodiment of the present invention, body diodes of the MOSFETS 430, 435 may act as output "OR" diodes as the body diodes may be shunted by the MOSFETS 430, 435 when the MOSFETS 430, 435 are switched on.

The output isolation circuitry of FIG. 4 including a comparator 420, 425, a MOSFET 435, 440, and a resistor 440, 445 may operate in a similar manner as the isolation circuitry as described with respect to the power supply system 300 of FIG. 3. Current may be allowed to pass with minimal power dissipation while providing isolation for power supply 130. When current flows from the anode to cathode of a body diode of MOSFET 435, 440, comparator 420, 425 may detect the current flow and provide a gate voltage to MOSFET 430, 435. This may cause MOSFET 430, 435 to turn on, allowing current to flow through from power supply 130 to load 410 with minimal power dissipation. In an embodiment of the invention, MOSFET 430, 435 may be a very low "on resistance" type of transistor. Thus, power dissipation may be an amount of the drain to source current squared ($Ids^2$) times the drain to source resistance of the MOSFET when on (RDSon).

Reverse current flow into power supply 130 may be prevented as resistor 440, 445 may pull the positive input of comparator 420, 425 and the anode of the MOSFET 430, 435 body diode to ground. This may back bias the MOSFET 430, 435 body diode. Back biasing of the diode may be detected by the comparator 420, 425 which turns the gate voltage for MOSFET 310 off. Thus, the flow of reverse current into power supply will be prevented. An advantageous aspect of the power supply system 400 of FIG. 4 is the rate at which the MOSFET 430, 435 is shut off after detection of reverse current flow. The isolation circuitry of the present invention including use of a comparator 420, 425 reduces the delay of switching the MOSFET off to a few microseconds.

It should be understood that comparator 320 of FIG. 3 and comparator 420, 425 of FIG. 4 may include any device, circuitry and the like to provide a high or low output depending upon the value of two inputs. While comparator is shown as an operational amplifier, it should be understood by those with ordinary skill in the art that other types and configurations may be utilized in order to provide the functionality of a comparator. Additionally, comparator may be equipped with independent voltage supplies, resistor-capacitor filtering, and the like to provide more precise voltage monitoring by comparator. Additionally, it should be understood that other types of transistors may be employed in lieu of a MOSFET to achieve similar functionality. For example, a bipolar junction transistor may be employed to operate similarly to a diode while providing low power dissipation.

The MOSFETS 310, 430 and 435 of FIGS. 3-4 include a symbol of a diode. The diode symbol may refer to the internal body diode of the MOSFETS created during fabrication. Consequently, MOSFETS 310, 430, and 435 may refer to a single FET transistor only, and do not include an additional, separate and distinct diode. It is also contemplated that the functional equivalent of MOSFET 310, 430 and 435 may be implemented by those with ordinary skill in the art the by use of two MOSFETS, one transistor functioning as a switching mechanism and another transistor functioning as the body diode without departing from the scope and spirit of the present invention.

It is believed that the method and system of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A system for isolating a power supply from reverse current flow when coupled to an input supply, comprising:
    an input supply, said input supply providing an unregulated DC voltage;
    a transistor having a first, second and third terminal, said first terminal being coupled to said input supply;
    a comparator coupled across said first terminal and said third terminal of said transistor;
    a resistor, said resistor coupling an input of said comparator to ground, said resistor being further coupled to an output of said input supply; and
    a power supply coupled to said third terminal of said transistor, said power supply being DC/DC conversion power supply which receives an unregulated DC voltage from said input supply and provides a regulated DC voltage; wherein said comparator applies a voltage to said transistor to turn said transistor on when said comparator detects current flow from an anode to a cathode of a body diode of said transistor when said input supply is operating to allow current to flow from said input supply through said transistor to said power supply, said comparator removing said voltage to said transistor to prevent reverse current flow within said power supply when input supply is shut down, said transistor being a MOSFET, said first terminal being a source, said second terminal being a gate and said third terminal being a drain of said MOSFET.

2. The system as claimed in claim 1, wherein a power dissipation across said transistor is proportional to the on resistance of said transistor and an amount of current flow from said input supply to said power supply.

3. The system as claimed in claim 1, wherein upon shutting off of said input supply, voltage to said transistor is removed within a few microseconds.

4. The system as claimed in claim 1, wherein said comparator applies said voltage to said gate of said transistor to turn the transistor on.

5. The system as claimed in claim 1, wherein said comparator is an operational amplifier.

6. The system as claimed in claim 1, wherein said resistor is coupled to a positive input of said comparator.

7. The system as claimed in claim 6, wherein said resistor pulls said positive input of said comparator to ground.

8. The system as claimed in claim 1, wherein said resistor pulls said anode of said body diode of said transistor to ground.

9. The system as claimed in claim 8, wherein said resistor provides back bias for the transistor.

10. A system for isolating a power supply from reverse current flow when coupled to an input supply, comprising:
    an input supply, said input supply providing an unregulated DC voltage;
    a transistor having a first, second and third terminal, said first terminal being coupled to said input supply;
    a comparator coupled across said first terminal and said third terminal of said transistor; and
    a power supply coupled to said third terminal of said transistor, said power supply being DC/DC conversion power supply which receives an unregulated DC voltage from said input supply and provides a regulated DC voltage; wherein said comparator applies a voltage to said transistor to turn said transistor on when said comparator detects current flow from an anode to a cathode of a body diode of said transistor when said input supply is operating to allow current to flow from said input supply through said transistor to said power supply, said comparator removing said voltage to said transistor to prevent reverse current flow within said power supply when input supply is shut down, said transistor being a MOSFET, said first terminal being a source, said second terminal being a gate and said third terminal being a drain of said MOSFET.

11. The system as claimed in claim 10, wherein a power dissipation across said transistor is proportional to the on resistance of said transistor and an amount of current flow from said power supply to said load.

12. The system as claimed in claim 10, wherein said comparator applies said voltage to said gate of said transistor to turn the transistor on.

13. The system as claimed in claim 10, wherein said comparator is an operational amplifier.

14. The system as claimed in claim 10, further comprising a second power supply, said second power supply providing redundant power.

15. The system as claimed in claim 14, further comprising a second transistor having a first, second and third terminal, said first terminal being coupled to said second power supply.

16. The system as claimed in claim 14, further comprising a second comparator coupled across said first terminal and said third terminal of said second transistor.

17. The system as claimed in claim 16, further comprising a load coupled to said third terminal of said second transistor; wherein said second comparator applies a voltage to said second transistor to turn said second transistor on to allow current to flow from said second power supply through said second transistor to said load, said second comparator removing said voltage to said second transistor to prevent reverse current flow within said second power supply.

18. The system as claimed in claim 17, said second transistor being a MOSFET, said first terminal being a source, said second terminal being a gate, and said third terminal being a drain of said MOSFET.

19. The system as claimed in claim 18, wherein said second comparator applies said voltage to said gate of said second transistor to turn the second transistor on.

20. The system as claimed in claim 19, wherein said second comparator is an operational amplifier.

21. The system as claimed in claim 10, wherein said resistor is coupled to a positive input of said comparator.

22. The system as claimed in claim 21, wherein said resistor pulls said positive input of said comparator to ground.

23. The system as claimed in claim 10, wherein said resistor pulls said anode of said body diode of said transistor to ground.

24. The system as claimed in claim 23, wherein said resistor provides back bias for the transistor.

* * * * *